United States Patent
Shumarayev et al.

(10) Patent No.: US 7,590,207 B1
(45) Date of Patent: Sep. 15, 2009

(54) MODULAR SERIAL INTERFACE IN PROGRAMMABLE LOGIC DEVICE

(75) Inventors: Sergey Y Shumarayev, San Leandro, CA (US); Rakesh H Patel, Cupertino, CA (US); Wilson Wong, San Francisco, CA (US); Tim Tri Hoang, San Jose, CA (US); William Bereza, Nepean (CA)

(73) Assignee: Altera Corporation, San Jose, CA (US)

( * ) Notice: Subject to any disclaimer, the term of this patent is extended or adjusted under 35 U.S.C. 154(b) by 764 days.

(21) Appl. No.: 11/256,346

(22) Filed: Oct. 20, 2005

(51) Int. Cl.
*H04L 7/00* (2006.01)
(52) U.S. Cl. .................. 375/354; 375/375; 375/220; 375/221; 331/11
(58) Field of Classification Search .................. 375/354
See application file for complete search history.

(56) References Cited

U.S. PATENT DOCUMENTS

| | | | | |
|---|---|---|---|---|
| 5,124,669 A | * | 6/1992 | Palmer et al. ................ 331/1 A |
| 5,483,180 A | * | 1/1996 | Chai et al. .................... 326/93 |
| 6,167,077 A | * | 12/2000 | Ducaroir et al. ............. 375/219 |
| 6,476,681 B1 | * | 11/2002 | Kirkpatrick ................... 331/17 |
| 6,566,967 B1 | * | 5/2003 | Anumula et al. ............. 331/11 |
| 6,924,678 B2 | | 8/2005 | Starr |
| 2005/0024085 A1 | * | 2/2005 | Chen et al. .................... 326/40 |

* cited by examiner

*Primary Examiner*—Shuwang Liu
*Assistant Examiner*—Lihong Yu
(74) *Attorney, Agent, or Firm*—Ropes & Gray LLP; Jeffrey H. Ingerman

(57) ABSTRACT

A serial interface for a programmable logic device can be used as a conventional high-speed quad interface, but also allows an individual channel, if not otherwise being used, to be programmably configured as a loop circuit (e.g., a phase-locked loop). This is accomplished by disabling the data loop of clock-data recovery circuitry in the channel, and reconfiguring the reference loop to operate as a loop circuit. In addition, instead of providing a high-speed quad interface having four channels and one or more clock management units (CMUs), a more flexible interface having five or more channels can be provided, and when it is desired to use the interface as a high-speed quad interface, one or more channels can be configured as loop circuits to function as CMUs.

36 Claims, 3 Drawing Sheets

US 7,590,207 B1

MODULAR SERIAL INTERFACE IN PROGRAMMABLE LOGIC DEVICE

BACKGROUND OF THE INVENTION

This invention relates to a high-speed serial interface (HSSI) in a programmable logic device (PLD) in which individual interface cells can have multiple functions. More particularly, this invention relates to a modified HSSI "quad" whose elements or cells can function as clock-data recovery (CDR) modules or as phase-locked loops (PLLs) or clock management units.

It has become common for PLDs to incorporate high-speed serial interfaces to accommodate high-speed (i.e., greater than 1 Gbps) serial I/O standards—e.g., the XAUI (Extended Attachment Unit Interface) standard and other standards. A common implementation for the aforementioned XAUI standard involves groups, called "quads," of four transceiver channels. Each quad typically shares one or more additional modules or cells called "clock management units" (CMUs), which may include one or more PLLs or other clock sources (e.g., a delay-locked loop (DLL)) and which provide clock standards for the other modules in the quad.

It would be desirable to be able to provide a PLD with a more flexible HSSI structure.

SUMMARY OF THE INVENTION

The present invention provides an HSSI quad for a programmable logic device in which the modules of the HSSI quad can be used for more than one purpose. Specifically, because each HSSI module typically includes CDR circuitry, which has elements of a PLL, the module can be configured so that when it is not being used for CDR, it can be used, under programmable control of a user, as a PLL, in addition to the PLL(s) in the CMU(s) or elsewhere in the device. This requires only minor modifications to allow certain portions of the module to be disabled or controlled.

Similarly, minor modifications can be made to the CMU to allow it to function as an additional CDR module. Or more simply, instead of four HSSI modules and one or two CMUs, an HSSI quad can be made from five or six modules according to the invention. For use in, e.g., a XAUI implementation, four of the five or six modules can be configured as four HSSI modules. The fifth and/or sixth module can be configured as a PLL, to serve as a CMU as described in more detail below.

Thus, in accordance with the present invention there is provided a high-speed serial interface for a programmable logic device. The high-speed serial interface includes a plurality of clock-data recovery modules and at least one clock management unit including a loop circuit for frequency generation. Each of the clock-data recovery modules includes a clock data recovery loop, a frequency acquisition loop, and circuitry for programmably disabling the clock data recovery loop. Thus, any one or more of the clock data recovery modules is programmably configurable as an additional frequency generation unit.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-3.

Figure 1:
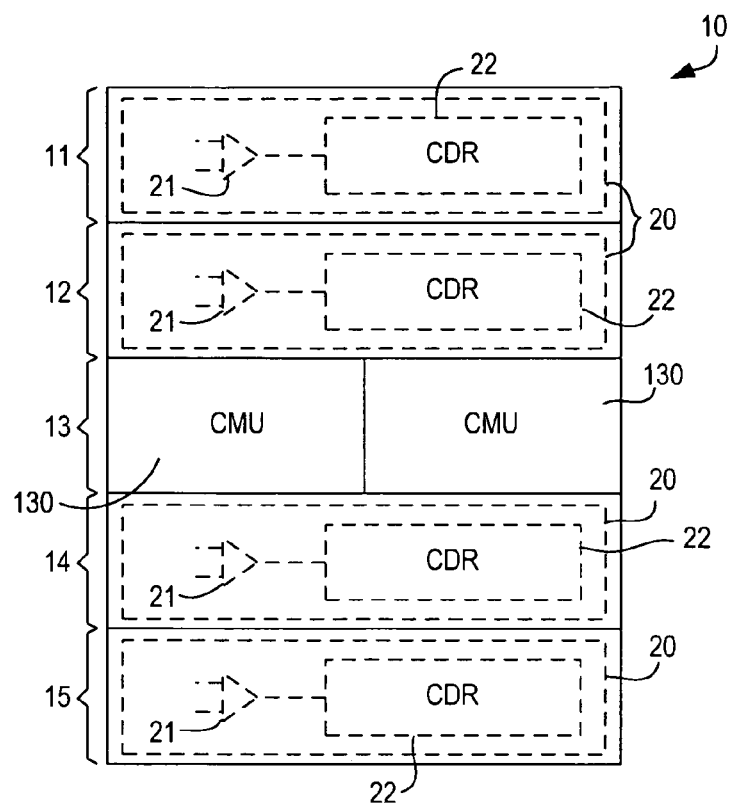
FIG. 1 is a schematic representation of a first embodiment of a quad in accordance with the present invention.

As seen in FIG. 1, HSSI quad 10 in accordance with the present invention resembles a conventional HSSI quad such as may be used, e.g., with the aforementioned XAUI standard. Typically, such a quad has five "slices" 11-15, with transceivers including CDR circuitry in slices 11, 12, 14 and 15, and central logic including one or more CMUs 130 in slice 13.

The CDR circuitry in a known HSSI transceiver channel typically has a "dual loop" configuration. The actual clock recovery is performed in what may be referred to as a clock data recovery loop, or data loop, which includes a phase detector at the input, followed by a charge pump, a loop filter a signal generator (e.g., a voltage-controlled oscillator (VCO)) and potentially an output counter/divider, with the output fed back to the phase detector, and also latched in an output data latch.

A second loop, known as a reference loop or a frequency acquisition loop, is used to start up the CDR process, to get the data loop to a frequency close to its actual operating frequency. The reference loop shares the charge pump, loop filter, signal generator and output counter/divider with the data loop, and also has a phase-frequency detector in place of the data loop's phase detector, as well as, normally, a feedback counter/divider. The input of the reference loop at the phase-frequency detector is a reference frequency source, and the output is fed back to input at the phase-frequency detector.

It will be recognized from the foregoing description of the reference loop that the reference loop is essentially a phase-locked loop if the signal generator is a VCO (or a current-controlled oscillator (CCO)), or essentially a delay-locked loop (DLL) if the signal generator is a voltage-controlled delay line or current-controlled delay line. Therefore, if the HSSI is part of a PLD and in a particular user logic design does not use a particular transceiver, the present invention makes that transceiver available as a loop circuit if the user logic design needs additional clock, phase or frequency standards beyond those already provided for. FIG. 2 shows receiver circuitry 20 in such a transceiver according to the present invention that can be programmably configured as a PLL.

Figure 2:
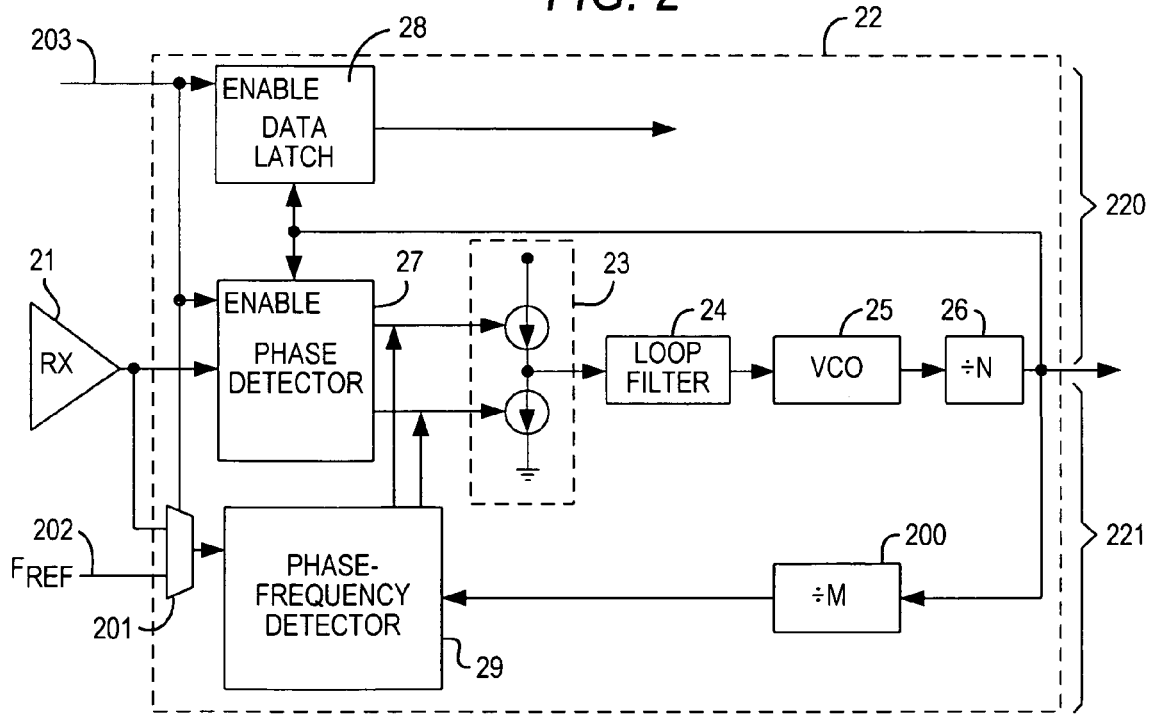
FIG. 2 is a schematic representation of one module of the quad of FIG. 1.

In FIG. 2, receiver circuitry 20 is shown with receiver 21 and CDR circuitry 22. CDR circuitry 22 preferably includes data loop 220 and reference loop 221. Data loop 220 and reference loop 221 preferably share charge pump 23, loop filter 24 and, in this example, VCO 25, as well as output counter/divider 26 which preferably is programmable.

Data loop 220 preferably also includes, at its input, a phase detector 27 and, at its output, a data latch 28. The output preferably is also fed back to phase detector 27 which thus preferably receives as inputs both the output of receiver 21 and the output of data loop 220.

Reference loop 221 preferably also includes, at its input, a phase-frequency detector (PFD) 29 and, at its output, a feedback counter/divider 200. The output of counter/divider 200 preferably is fed back to PFD 29, which preferably also receives as an input the output of a multiplexer 201. Multiplexer 201 preferably selects between a reference frequency 202 and the output of receiver 21.

Preferably, a single signal 203 can be used to either (1) enable phase detector 27 and data latch 28 and select reference frequency 202 for input to PFD 29, or (2) disable phase detector 27 and data latch 28 and select the output of receiver 21 for input to PFD 29. Preferably also, the programmability of components such as loop filter 24, which normally is available only in connection with data loop 220, is made available in reference loop 221 as well.

If a user logic design uses all channels 11, 12, 14, 15 of HSSI quad 10, then in each channel, signal 203 preferably will be used to enable phase detector 27 and data latch 28 and select reference frequency 202 for input to PFD 29, thereby selecting ordinary CDR operations. If a user logic design does not use all of channels 11, 12, 14, 15 of HSSI quad 10, then the present invention makes those channels available as loop circuits (e.g., as clock, frequency or phase sources). If an entire HSSI quad 10 is not being used, the loop circuits of its CMUs are available, and the individual channels can be configured according to the invention as additional loop circuits, by asserting a value of signal 203 that disables phase detector 27 and data latch 28 and selects the output of receiver 21 for input to PFD 29. Even if a quad 10 is in use, if a particular channel is not in use then according to the invention that channel can be configured as a loop circuit.

Figure 3:
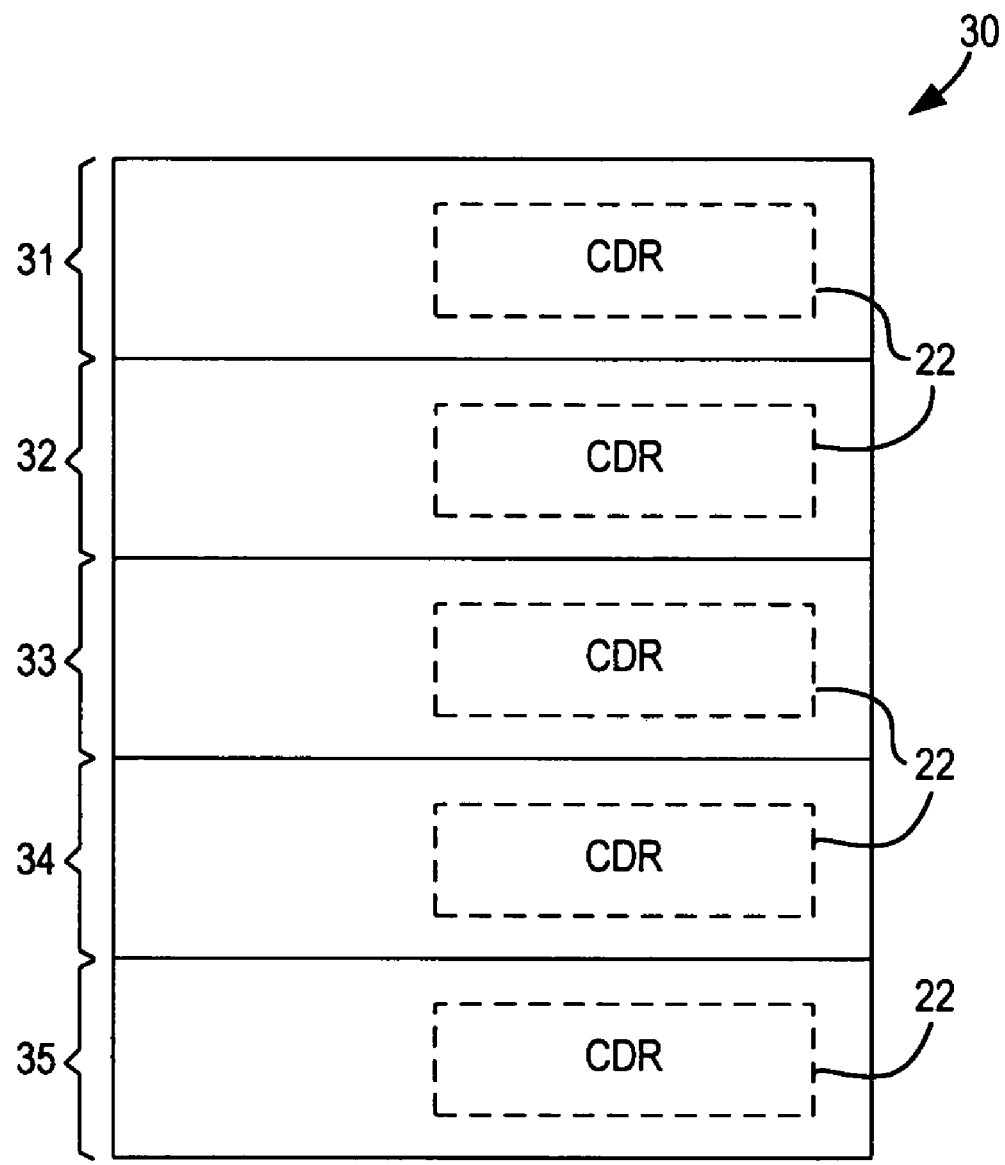
FIG. 3 is a schematic representation of a second embodiment of a quad in accordance with the present invention.

A second preferred embodiment of the invention is shown in FIG. 3. Because the invention allows any channel to be configured as a loop circuit as described in connection with FIGS. 1 and 2, in this embodiment, instead of a quad 10, a bank 30 of five (or more) channels 31-35 can be provided, each having CDR circuitry 22. When the user logic design requires an HSSI quad (e.g., the user implements a XAUI interface), then the CDR circuitry 22 of channel 33 can be configured as a PLL in the manner described above, so that channel 33 effectively becomes a CMU. Otherwise, if the user design does not require an HSSI quad, channels 31-35 can be used for any purpose, either as transceiver interfaces, or as loop circuits as in FIGS. 1 and 2.

Thus it is seen that flexible interface circuitry that provides a user with the option of configuring additional loop circuits when the interface is not being used, as well as a more flexible interface structure that can dispense with dedicated CMUs, has been provided.

Figure 4:
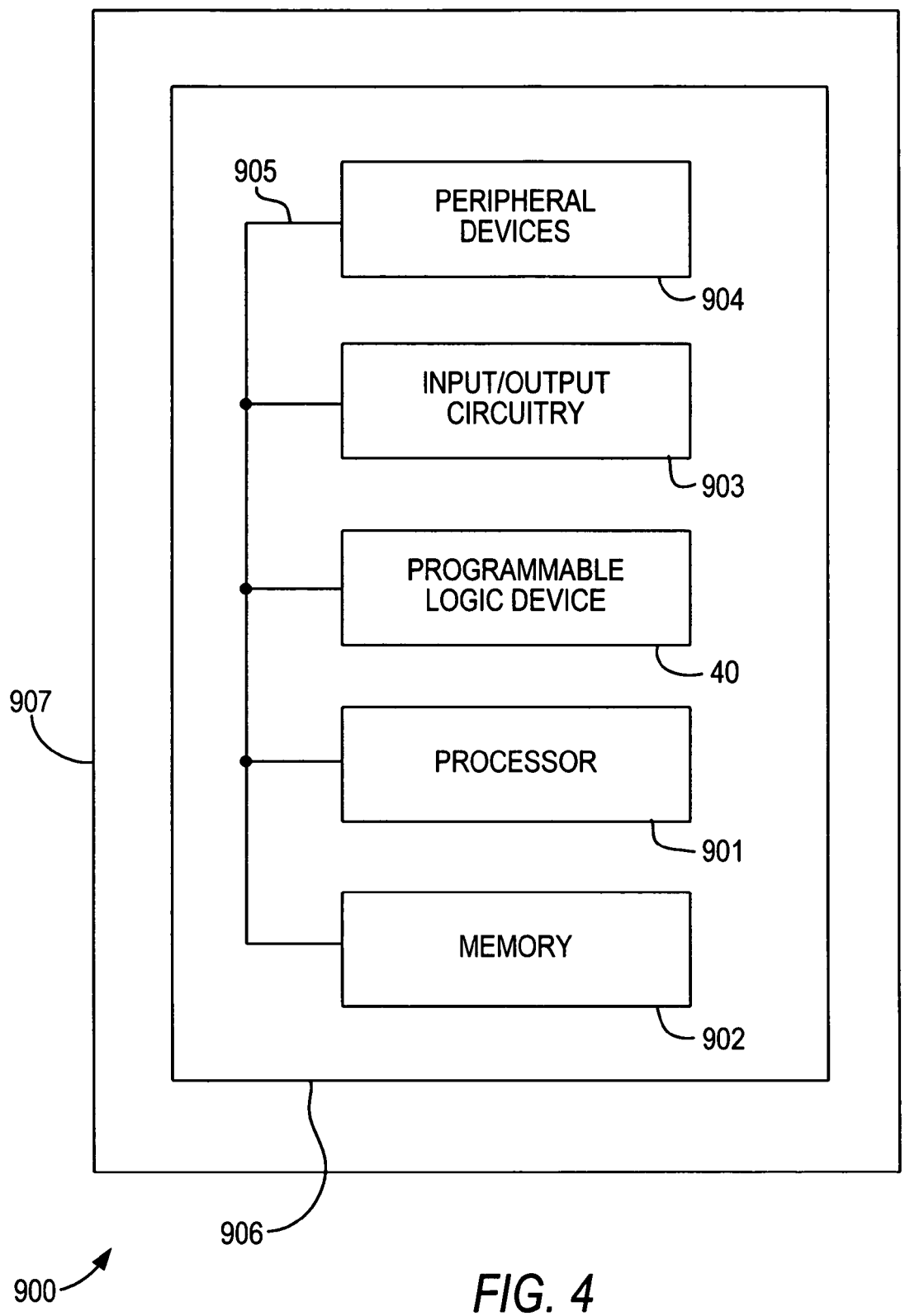
FIG. 4 is a simplified block diagram of an illustrative system employing a programmable logic device incorporating with the present invention.

A PLD 40 incorporating such circuitry according to the present invention may be used in many kinds of electronic devices. One possible use is in a data processing system 900 shown in FIG. 4. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 40 can be used to perform a variety of different logic functions. For example, PLD 40 can be configured as a processor or controller that works in cooperation with processor 901. PLD 40 may also be used as an arbiter for arbitrating access to a shared resources in system 900. In yet another example, PLD 40 can be configured as an interface between processor 901 and one of the other components in system 900. It should be noted that system 900 is only exemplary, and that the true scope and spirit of the invention should be indicated by the following claims.

Various technologies can be used to implement PLDs 30 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A high-speed serial interface for a programmable logic device, said high-speed serial interface comprising a plurality of clock-data recovery modules and at least one clock management unit including a loop circuit for frequency generation, each of said clock-data recovery modules comprising:
   a clock-data recovery loop;
   a frequency acquisition loop having a programmable selector for selecting, as an input to said frequency acquisition loop, one of (a) a first signal, and (b) an input of said clock-data recovery loop; and
   circuitry for programmably enabling and disabling said clock-data recovery loop by applying a control signal, said control signal also controlling said programmable selector to (i) select said first signal when enabling said clock-data recovery loop, and (ii) select said input of said clock-data recovery loop when disabling said clock-data recovery loop; whereby:
   any one or more of said clock-data recovery modules is programmably configurable as an additional frequency generation unit by applying said control signal to disable said clock-data recovery loop and to select said input of said clock-data recovery loop as an input to said frequency acquisition loop.

2. The high-speed serial interface of claim 1 wherein said loop circuit for frequency generation comprises a phase-locked loop.

3. The high-speed serial interface of claim 2 wherein said frequency acquisition loop comprises a phase-locked loop.

4. The high-speed serial interface of claim 1 wherein said frequency acquisition loop comprises a phase-locked loop.

5. The high-speed serial interface of claim 1 wherein said clock-data recovery loop and said frequency acquisition loop share a charge pump, a loop filter and an oscillator, said loop filter being programmably adjustable in said clock-data recovery loop; wherein:
   said loop filter is also programmably adjustable in said frequency acquisition loop; whereby:
   said additional frequency generation unit is programmably adjustable.

6. The high-speed serial interface of claim 1 wherein:
   said clock-data recovery loop comprises a phase detector and a data latch at an input thereof; and
   said control signal programmably enables and disables at least one of said phase detector and said data latch.

7. The high-speed serial interface of claim 1 wherein said first signal is a reference signal for said frequency acquisition loop.

8. The high-speed serial interface of claim 1 wherein said programmable selector comprises a multiplexer.

9. A programmable logic device comprising the high-speed serial interface of claim 1.

10. A digital processing system comprising:
    processing circuitry;
    a memory coupled to said processing circuitry; and
    a programmable logic device as defined in claim 9 coupled to the processing circuitry and the memory.

11. A printed circuit board on which is mounted a programmable logic device as defined in claim 9.

12. The printed circuit board defined in claim 11 further comprising:
memory circuitry mounted on the printed circuit board and coupled to the programmable logic device.

13. The printed circuit board defined in claim 12 further comprising:
processing circuitry mounted on the printed circuit board and coupled to the memory circuitry.

14. An integrated circuit device comprising the high-speed serial interface of claim 1.

15. A digital processing system comprising:
processing circuitry;
a memory coupled to said processing circuitry; and
an integrated circuit device as defined in claim 14 coupled to the processing circuitry and the memory.

16. A printed circuit board on which is mounted an integrated circuit device as defined in claim 15.

17. The printed circuit board defined in claim 16 further comprising:
memory circuitry mounted on the printed circuit board and coupled to the programmable logic device.

18. The printed circuit board defined in claim 17 further comprising:
processing circuitry mounted on the printed circuit board and coupled to the memory circuitry.

19. A high-speed serial interface for a programmable logic device, said high-speed serial interface comprising a plurality of clock-data recovery modules, each of said clock-data recovery modules comprising:
a clock-data recovery loop;
a frequency acquisition loop having a programmable selector for selecting, as an input to said frequency acquisition loop, one of (a) a first signal, and (b) an input of said clock-data recovery loop; and
circuitry for programmably enabling and disabling said clock-data recovery loop by applying a control signal, said control signal also controlling said programmable selector to (i) select said first signal when enabling said clock-data recovery loop, and (ii) select said input of said clock-data recovery loop when disabling said clock-data recovery loop; whereby:
any one or more of said clock-data recovery modules is programmably configurable as a clock management unit for said high-speed serial interface by applying said control signal to disable said clock-data recovery loop and to select said input of said clock-data recovery loop as an input to said frequency acquisition loop.

20. The high-speed serial interface of claim 19 wherein said clock management unit comprises a phase-locked loop.

21. The high-speed serial interface of claim 20 wherein said frequency acquisition loop comprises a phase-locked loop.

22. The high-speed serial interface of claim 19 wherein said frequency acquisition loop comprises a phase-locked loop.

23. The high-speed serial interface of claim 19 wherein said clock-data recovery loop and said frequency acquisition loop share a charge pump, a loop filter and an oscillator, said loop filter being programmably adjustable in said clock-data recovery loop; wherein:
said loop filter is also programmably adjustable in said frequency acquisition loop; whereby:
said clock management unit is programmably adjustable.

24. The high-speed serial interface of claim 19 wherein:
said clock-data recovery loop comprises a phase detector and a data latch at an input thereof; and
said control signal programmably enables and disables at least one of said phase detector and said data latch.

25. The high-speed serial interface of claim 19 wherein said first signal is a reference signal for said frequency acquisition loop.

26. The high-speed serial interface of claim 19 wherein said programmable selector comprises a multiplexer.

27. A programmable logic device comprising the high-speed serial interface of claim 19.

28. A digital processing system comprising:
processing circuitry;
a memory coupled to said processing circuitry; and
a programmable logic device as defined in claim 27 coupled to the processing circuitry and the memory.

29. A printed circuit board on which is mounted a programmable logic device as defined in claim 27.

30. The printed circuit board defined in claim 29 further comprising:
memory circuitry mounted on the printed circuit board and coupled to the programmable logic device.

31. The printed circuit board defined in claim 30 further comprising:
processing circuitry mounted on the printed circuit board and coupled to the memory circuitry.

32. An integrated circuit device comprising the high-speed serial interface of claim 19.

33. A digital processing system comprising:
processing circuitry;
a memory coupled to said processing circuitry; and
an integrated circuit device as defined in claim 32 coupled to the processing circuitry and the memory.

34. A printed circuit board on which is mounted an integrated circuit device as defined in claim 33.

35. The printed circuit board defined in claim 34 further comprising:
memory circuitry mounted on the printed circuit board and coupled to the programmable logic device.

36. The printed circuit board defined in claim 35 further comprising:
processing circuitry mounted on the printed circuit board and coupled to the memory circuitry.

* * * * *

UNITED STATES PATENT AND TRADEMARK OFFICE
CERTIFICATE OF CORRECTION

PATENT NO.       : 7,590,207 B1                                    Page 1 of 1
APPLICATION NO. : 11/256346
DATED            : September 15, 2009
INVENTOR(S)      : Shumarayev et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1000 days.

Signed and Sealed this

Twenty-first Day of September, 2010

David J. Kappos
*Director of the United States Patent and Trademark Office*